United States Patent [19]
Ohsono

[11] Patent Number: 5,831,310
[45] Date of Patent: Nov. 3, 1998

[54] SEMICONDUCTOR DEVICE FOR CHECKING QUALITY OF A SEMICONDUCTOR REGION

[75] Inventor: Katsuhiro Ohsono, Tokyo, Japan

[73] Assignee: NEC Corporation, Tokyo, Japan

[21] Appl. No.: 938,561

[22] Filed: Sep. 26, 1997

Related U.S. Application Data

[63] Continuation of Ser. No. 652,391, May 23, 1996, abandoned.

[30] Foreign Application Priority Data

May 24, 1995 [JP] Japan .................................... 7-124961

[51] Int. Cl.⁶ .................................................. H01L 27/01
[52] U.S. Cl. .......................... 257/349; 257/354; 257/376; 257/398; 257/399
[58] Field of Search ..................... 257/349, 399, 257/409, 354, 376, 398, 400, 652

[56] References Cited

U.S. PATENT DOCUMENTS

| | | | |
|---|---|---|---|
| 4,013,484 | 3/1977 | Boleky et al. | 257/652 |
| 4,459,741 | 7/1984 | Schwabe et al. | 257/376 |
| 4,574,467 | 3/1986 | Halfacre et al. | 257/376 |
| 4,697,199 | 9/1987 | De Graaff et al. | 257/398 |
| 5,670,816 | 9/1997 | Hatano et al. | 257/400 |

FOREIGN PATENT DOCUMENTS

| | | | |
|---|---|---|---|
| 358007838 | 1/1983 | Japan | 257/399 |
| 359194462 | 11/1984 | Japan | 257/652 |
| 404062975 | 2/1992 | Japan | 257/376 |
| 406061484 | 3/1994 | Japan | 257/399 |

OTHER PUBLICATIONS

Dockerty, Formation of Low Capacitance Diffusions, IBM Technical Disclosure Bulletin, vol. 24, No. 3, Aug. 1981.

*Primary Examiner*—Carl W. Whitehead, Jr.
*Attorney, Agent, or Firm*—Sughrue, Mion, Zinn, Macpeak & Seas, PLLC

[57] ABSTRACT

A semiconductor device includes a flat, square n-type diffusion layer, a p-type channel stopper region, and an electrode. The n-type diffusion layer is formed to be isolated in a check element region of a p-type semiconductor substrate or a p-type well covered with a field oxide film and having circuit element regions and the check element region sandwiched therebetween. The p-type channel stopper region is formed to contact at least one side of the n-type diffusion layer. The electrode is extracted from the n-type diffusion layer through a contact hole. The n-type diffusion layer, the p-type channel stopper region, and the electrode constitute the check element for checking a state of the p-type channel stopper region by measuring a junction breakdown voltage of the n-type diffusion layer.

8 Claims, 12 Drawing Sheets

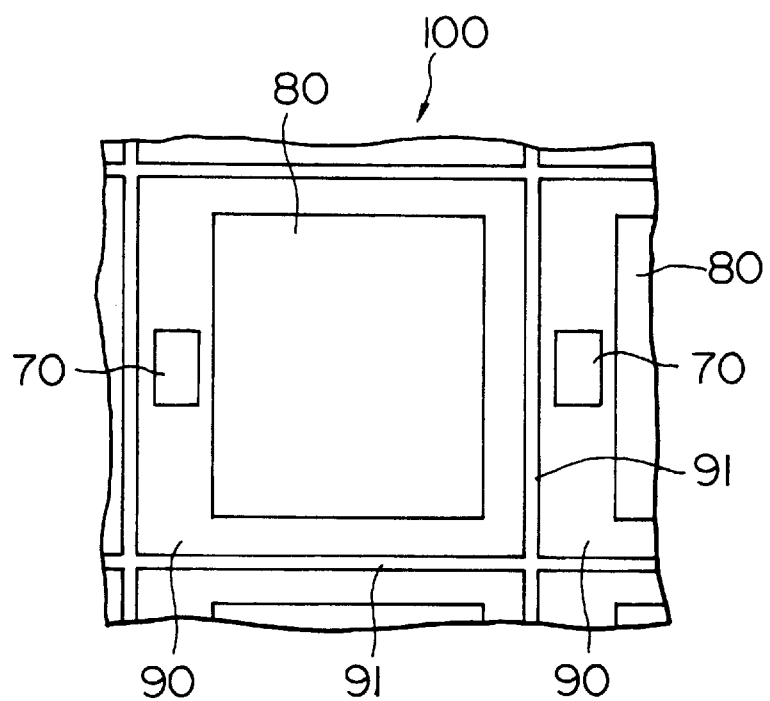

SEMICONDUCTOR DEVICE FOR CHECKING QUALITY OF A SEMICONDUCTOR REGION

This is a Continuation of application Ser. No. 08/652,391 filed on May 23, 1996, now abandoned.

BACKGROUND OF THE INVENTION

1. Field of the Invention

The present invention relates to a semiconductor device and a method of manufacturing the same and, more particularly, to a semiconductor device for checking the quality of a p-type channel stopper region or a guard ring region (both are representatively referred to as a channel stopper region in this specification) immediately below a field oxide film, and a method of manufacturing the same.

2. Description of the Prior Art

When a complementary semiconductor device is used as a component for space equipment, electrostatic current consumption undesirably increases due to cosmic rays (e.g., γ-rays).

This is because hole-electron pairs are generated in a field oxide film upon irradiation of γ-rays and the like, and the holes having a low mobility are captured at the interface between a silicon substrate and a silicon oxide film to generate fixed positive charges. More specifically, the surface of the silicon substrate immediately below the field oxide film of a parasitic NMOS transistor is inverted (i.e., the threshold voltage decreases) to flow a leakage current, resulting in an increase in electrostatic current consumption.

To prevent this increase in leakage current, a heavily doped p-type channel stopper region must be formed immediately below the field oxide film. In this case, there is also proposed a p-type channel stopper region formed to be spaced apart from n-type diffusion layers such as n-type source and drain regions so as to prevent a decrease in breakdown voltage.

For example, the heavily doped p-type channel stopper region is formed to be spaced apart from n-type diffusion layers by a technique of diffusing a p-type impurity in a substrate prior to formation of a thick field oxide film, which is disclosed in Japanese Unexamined Patent Publication No. 2-304949, or by a technique of implanting p-type impurity ions through a thick field oxide film with a high energy upon formation of the field oxide film, which is disclosed in Japanese Unexamined Patent Publication No. 6-140502.

In either case, the quality, i.e., element isolation properties of the p-type channel stopper region must be checked. For this purpose, a check element is arranged.

A conventional check element will be described with reference to FIGS. 1A and 1B. FIG. 1A is a plan view, and FIG. 1B is a sectional view taken along a line IB—IB in FIG. 1A.

A field oxide film 51 is formed on a p-type semiconductor substrate 50, and n-type diffusion layers 63S and 63D are formed to sandwich a portion 51G of the field oxide film 51 therebetween. To improve the element isolation properties, a p-type channel stopper region 62 is formed immediately below the field oxide film 51G to be spaced apart from the n-type diffusion layers 63S and 63D, and a thin oxide film 64 is formed thereon. A polysilicon electrode 66 is formed on the field oxide film 51G and extends to the contiguous edge of the thin oxide film 64. Aluminum electrodes 67S and 67D are respectively extracted from contact holes 68 which reach the n-type diffusion layers 63S and 63D through the thin oxide film 64 from a BPSG film 52 as an insulating interlayer covered on the whole structure. An aluminum electrode 67G is extracted from a through hole 65 which reaches the polysilicon electrode 66 through the BPSG film 52.

The p-type channel stopper region 62, the n-type diffusion layers 63S and 63D, the thin oxide film 64, the polysilicon electrode 66, and the aluminum electrodes 67S, 67D, and 67G which constitute the check element shown in FIGS. 1A and 1B are formed simultaneously with a p-type channel stopper region, n-type source and drain regions, a gate oxide film, a polysilicon gate electrode, and aluminum electrodes, respectively, of an insulated gate field effect transistor (to be referred to as a MOS transistor hereafter) serving as a circuit element in a circuit element region defined on the same substrate. The field oxide film 51 (51G) and the insulating interlayer 52 in the check element shown in FIGS. 1A and 1B are also formed simultaneously with a field oxide film and an insulating interlayer, respectively, in the circuit element region.

This check element has a parasitic MOS transistor structure in which the n-type diffusion layer 63S serves as an n-type source region; the n-type diffusion layer 63D, as an n-type drain region; the polysilicon electrode 66, a gate electrode; and the field oxide film 51G, a gate insulating film. The size of each of the aluminum electrodes 67S, 67D, and 67G to which a probe is brought in contact to measure this parasitic MOS transistor is determined in accordance with the probing precision of a measuring apparatus, and is about 100 $\mu$m□ (area: $1 \times 10^4$ $\mu$m$^2$).

Generally, the following measurement is performed to evaluate element isolation properties using this element. More specifically, the drain region 63D is set to 5 V, and the source region 63S and the substrate 50 are set to 0 V (i.e., a ground potential). A gate voltage applied to the gate electrode 66 is gradually increased to obtain a gate voltage at which the drain current has a predetermined value (about 1 $\mu$A). This gate voltage is called the threshold voltage of a parasitic MOS transistor, and a higher voltage indicates better element isolation properties.

The threshold voltage of the parasitic MOS transistor is about 25 V when the field oxide film 51G formed by a local oxidation method of silicon called the LOCOS method has a film thickness of about 450 nm without improving the element isolation properties. When the element isolation properties are improved by forming the heavily doped p-type channel stopper region 62, the threshold voltage becomes about 40 V or more.

As described above, the element isolation state in the semiconductor device is conventionally checked by using the check element shown in FIGS. 1A and 1B.

This conventional technique, however, has the following problems.

First of all, as shown in FIG. 1B, the polysilicon electrode 66 partially overlaps the n-type diffusion layers 63S and 63D through the oxide film 64 as thin as the gate oxide film of the circuit element. If a voltage equal to or more than the intrinsic breakdown field (generally 10 MV/cm) of the thin oxide film 64 is applied to this overlapping portion, dielectric breakdown occurs. Since a recent gate oxide film has a film thickness of 20 nm, the thin oxide film 64 also has a film thickness of 20 nm. If the gate voltage exceeds 20 V, the oxide film 64 at this overlapping portion undergoes dielectric breakdown.

In addition, if the p-type channel stopper region is formed to improve the element isolation properties, the threshold voltage of the parasitic MOS transistor becomes about 40 V or more, and the state of the p-type channel stopper region cannot be evaluated.

To prevent the leakage current from being increased by fixed positive charges generated in the field oxide film, the p-type channel stopper must be heavily doped. The threshold voltage of the parasitic MOS transistor is measured to monitor this doped state. However, this threshold voltage value is easily affected by a variation in film thickness of the field oxide film, so the element isolation properties cannot be checked with a high sensitivity in accordance with the doped state of the p-type channel stopper.

For this evaluation, the three aluminum electrodes 67S, 67D, and 67G are required, as shown in FIG. 1B. As described above, the size of one aluminum electrode is about 100 $\mu m\square$, so that at least the area of $3\times10^4$ cm$^2$ is required to form an aluminum electrode pattern constituted by the three aluminum electrodes.

An area occupied by the check element must be as small as possible to increase the area supposed to be used by the circuit element region, so the check element requiring a large area as shown in FIGS. 1A and 1B is not desirable.

Further, the check element shown in FIGS. 1A and 1B cannot easily evaluate the direction and amount of misalignment between the n-type diffusion layer or the field oxide film and the p-type channel stopper region.

SUMMARY OF THE INVENTION

It is an object of the present invention to provide a semiconductor device having a check element which can check the quality of a p-type channel stopper region with a high sensitivity and a small pattern area without causing the intrinsic breakdown of an oxide film as thin as a gate oxide film, thereby evaluating element isolation properties, and a method of manufacturing the same.

It is another object of the present invention to provide a semiconductor device which can easily evaluate the misaligned state between n-type diffusion layers such as source and drain regions or a field oxide film and a channel stopper region, all of which are formed in the semiconductor device, and a method of manufacturing the same.

To achieve the above objects, according to the basic aspect of the present invention, there is provided a semiconductor device comprising a flat, square n-type diffusion layer formed to be isolated in a check element region of a p-type semiconductor substrate or a p-type well covered with a field oxide film and having circuit element regions and the check element region sandwiched between the circuit element regions, a p-type channel stopper region formed to contact at least one side of the n-type diffusion layer, and an electrode extracted from the n-type diffusion layer through a contact hole, thereby constituting the check element for checking a state of the p-type channel stopper region by measuring a junction breakdown voltage of the n-type diffusion layer.

The p-type channel stopper region of the semiconductor device described in the basic aspect may be formed to surround the n-type diffusion layer. The p-type channel stopper region may have a square, flat shape, four n-type diffusion layers may be formed to independently contact respective sides of the p-type channel stopper region, and electrodes may be respectively extracted from the four n-type diffusion layers.

According to the basic aspect of a manufacturing method of the present invention, there is provided a manufacturing method of manufacturing a semiconductor device comprising the steps of implanting boron ions through a field oxide film using, as a mask, a resist pattern formed on a p-type semiconductor substrate covered with the field oxide film and having circuit element regions and a check element region sandwiched between the circuit element regions to form a p-type channel stopper region at a predetermined position, forming an n-type diffusion layer in the check element region so as to at least partially contact the p-type channel stopper region, and forming electrode wiring layers in the circuit element regions and an electrode in the check element region.

With the above-described arrangement of the present invention, since the junction breakdown voltage of the n-type diffusion layer is measured to check the state of the p-type channel stopper, the state can be checked with a high sensitivity without causing the intrinsic breakdown of the oxide film as thin as a gate oxide film and without being affected by a variation in film thickness of the field oxide film. Since only one extraction electrode is required, the quality of the p-type channel stopper region can be checked. In addition, when the p-type channel stopper region is formed to surround the n-type diffusion layer, even if the p-type channel stopper region is formed to shift from the n-type diffusion layer, it does not affect a junction breakdown voltage value to be measured. On the other hand, four n-type diffusion layers are formed to independently contact the respective sides of the p-type channel stopper region, and the electrodes are extracted from the four n-type diffusion layers. With this arrangement, the misaligned state between the n-type diffusion layers such as source and drain regions or the field oxide film and the channel stopper region can be easily evaluated. Further, a p-type channel stopper region is formed by implanting boron ions through the field oxide film using a resist pattern as a mask, thereby coping with the check operation of a heavily doped p-type channel stopper region.

As described above, according to the present invention, an isolated n-type diffusion layer having a rectangular planar shape is formed on part of a p-type semiconductor substrate or p-type well, and a p-type channel stopper region for element isolation is brought in contact with at least one side of the n-type diffusion layer to measure the junction breakdown voltage of the n-type diffusion layer, thereby checking the quality, i.e., element isolation properties of the p-type channel stopper region. Therefore, in this check operation, the element isolation properties can be evaluated with a high sensitivity without causing the intrinsic breakdown of the thin oxide film on the n-type diffusion layer and without being affected by a variation in film thickness of the field oxide film. In addition, a pattern area for a check operation can be decreased. Furthermore, misalignment of the p-type channel stopper region can be easily evaluated.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIG. 3 is a plan view showing the wafer state of a semiconductor device of the present invention;

DETAILED DESCRIPTION OF PREFERRED EMBODIMENTS

Preferred embodiments of the present invention will be described below with reference to the accompanying drawings.

Figure 1A:
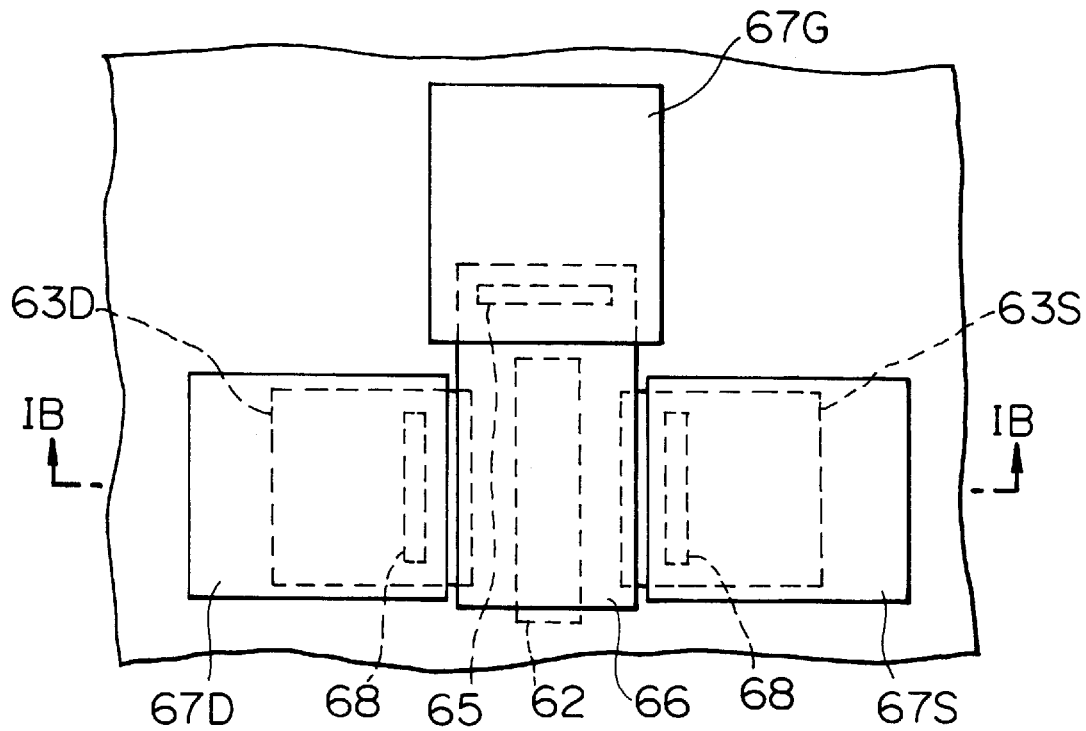
FIGS. 1A and 1B are a plan view and a sectional view, respectively, showing a semiconductor device of a prior art.
Figure 1B:
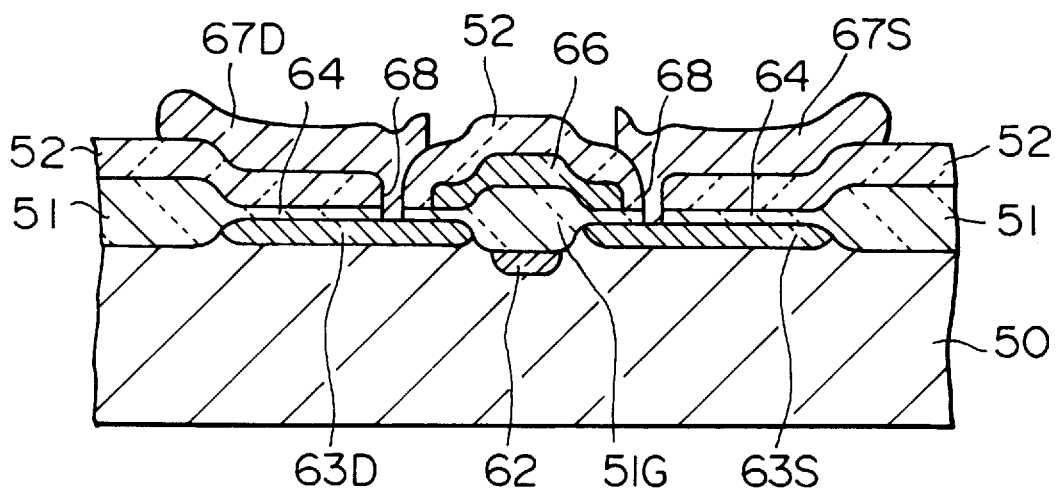
Figure 2A:
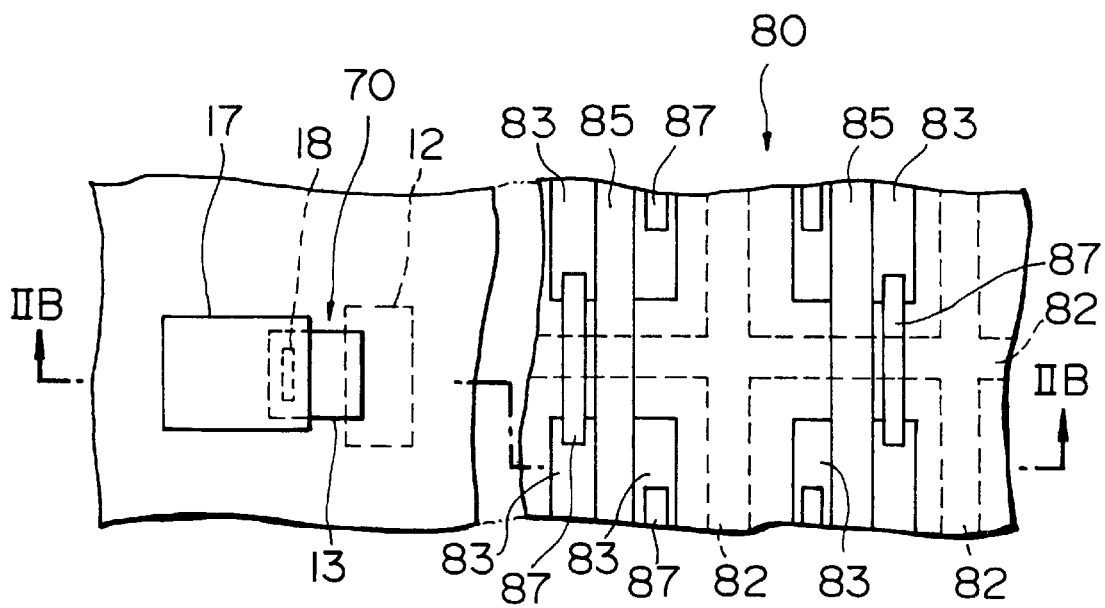
FIGS. 2A and 2B are a plan view and a sectional view, respectively, showing the first embodiment of the present invention.
Figure 2B:
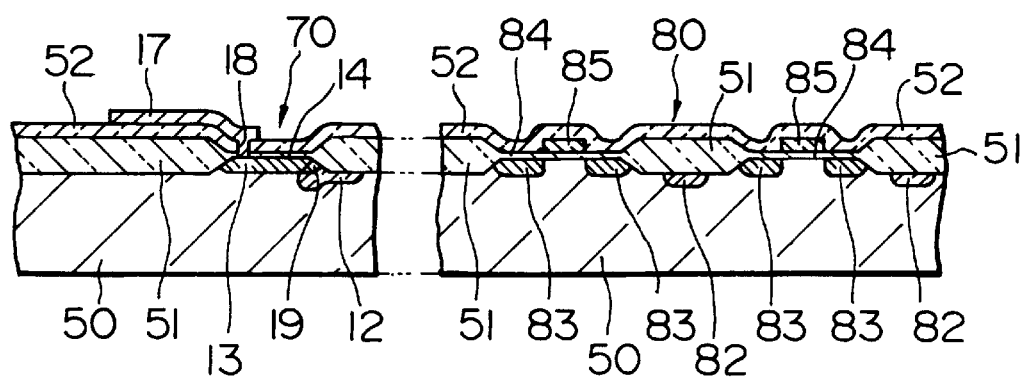
Figure 4A:
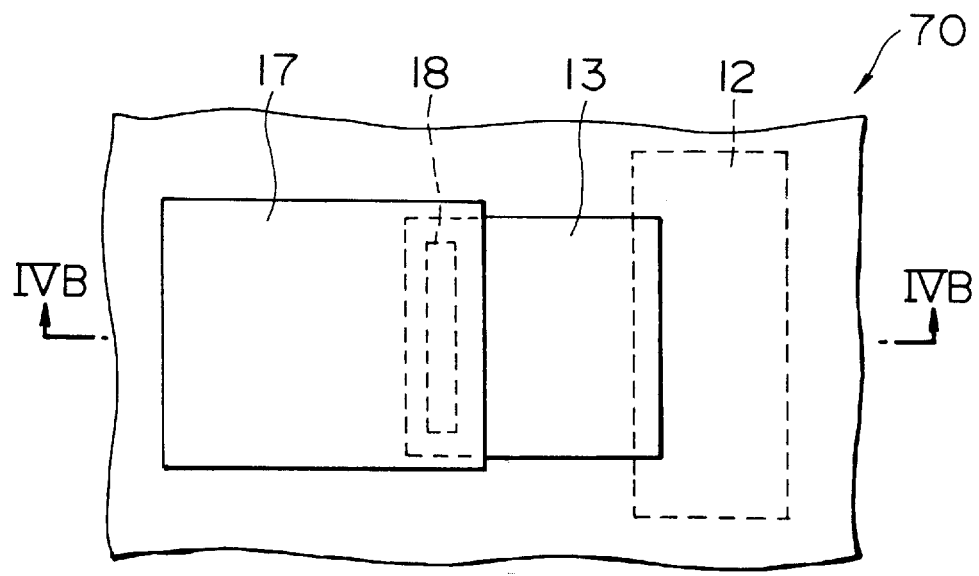
FIGS. 4A and 4B are an enlarged plan view and an enlarged sectional view, respectively, showing the first embodiment in FIGS. 2A and 2B.
Figure 4B:
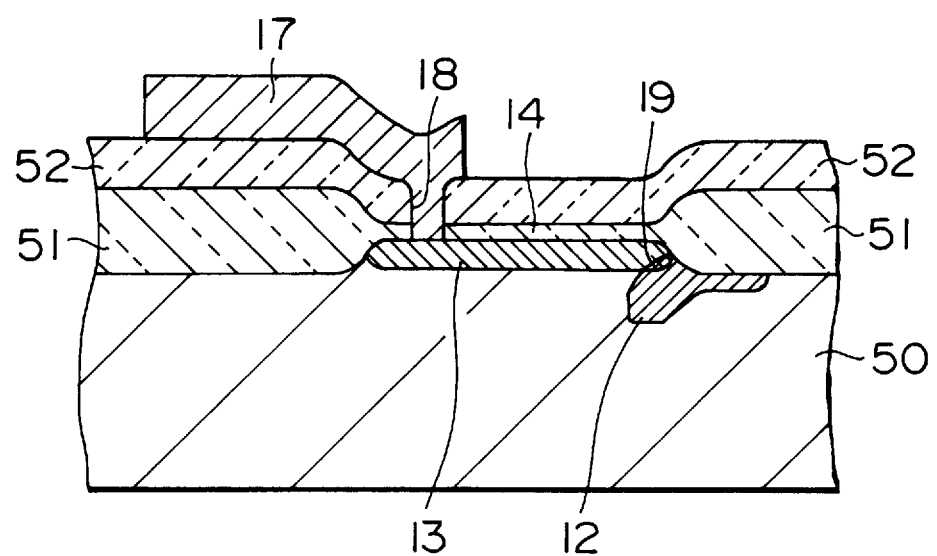

FIGS. 2A and 2B are views showing a semiconductor device according to the first embodiment of the present invention, in which FIG. 2A is a plan view, and FIG. 2B is a sectional view taken along a line IIB—IIB in FIG. 2A. FIG. 3 is a plan view showing the wafer state of the whole semiconductor device according to the embodiment of the present invention. FIGS. 4A and 4B are enlarged views, respectively, showing a check element in FIGS. 2A and 2B, in which FIG. 4A is a plan view, and FIG. 4B is a sectional view taken along a line IVB—IVB in FIG. 4A.

First of all, in FIG. 3, a large number of semiconductor devices 90 are partitioned by cutting regions 91 and manufactured on a semiconductor wafer 100, and cut in units of the cutting regions 91 to be isolated as individual semiconductor chips. Each semiconductor device 90 comprises a circuit element region 80 in which a circuit element is formed supposed to constitute an integrated circuit, and a check element region 70 in which a check element of the present invention for monitoring the formation state of a p-type channel stopper region in the circuit element region 80 is formed.

Referring to FIGS. 2A and 2B, a thick field silicon oxide film 51 is formed on the major surface of a p-type semiconductor substrate 50 or P-well 50 of a semiconductor substrate by a local oxidation method of silicon. A large number of MOS transistors each having n-type source and drain regions 83, a gate silicon oxide film 84, and a polysilicon gate electrode 85 are formed in the circuit element regions 80 on the p-type semiconductor substrate 50 or the p-well 50 of the semiconductor substrate. A BPSG film 52 is formed as an insulating interlayer on the whole structure. The polysilicon gate electrodes 85 provided common to other transistors, and aluminum electrode wiring layers 87 for connecting the n-type source and drain regions 83 constitute an integrated circuit.

Heavily doped p-type channel stopper regions 82 are formed on the bottom portions of the field oxide film 51 so as to be spaced apart from the n-type source and drain regions 83, thereby preventing generation of an undesirable leakage current between the respective MOS transistors.

On the other hand, in the check element region 70 on the p-type semiconductor substrate 50 or the p-well 50 of the semiconductor substrate, as is enlarged in FIGS. 4A and 4B, an n-type diffusion layer 13 which is surrounded by the field oxide film 51 to be isolated in an island shape is formed simultaneously with the n-type source and drain regions 83, a thin silicon oxide film 14 is formed thereon simultaneously with the gate oxide film 84, an insulating interlayer 52 as in the circuit element region is formed, a contact hole 18 which reaches the n-type diffusion layer 13 from the insulating interlayer 52 through the thin silicon oxide film 14 is formed, and an aluminum electrode 17 extending on the insulating interlayer 52 through the contact hole 18 is formed simultaneously with the aluminum electrode wiring layer 87. The area of the aluminum electrode 17 is about 100 $\mu m\square$ (area: $1\times10^4$ $\mu m^2$) required for measuring the breakdown voltage characteristics of the check element by bringing a probe in contact with the aluminum electrode 17.

Further, a checking p-type channel stopper region 12 is formed to overlap the n-type diffusion layer 13 at a contact portion 19. The p-type channel stopper region 12 of the check element and each p-type channel stopper region 82 in the circuit element region are simultaneously formed by ion implantation of a p-type impurity passing through the field oxide film 51 and a subsequent activation annealing process. Therefore, the impurity concentrations, diffusion depths, and the like of both the regions are equal to each other.

In the check element, a substrate electrode (not shown) for applying a substrate potential to the p-type semiconductor substrate 50 or the p-well 50 of the semiconductor substrate is set to 0 V (ground potential). A probe is brought in contact with the aluminum electrode 17, and a positive voltage is applied to the probe and gradually increased. In this state, the p-n junction breakdown voltage at the overlapping portion between the n-type diffusion layer 13 and the p-type channel stopper region 12 is measured to evaluate the states of the impurity concentrations of the p-type channel stopper regions 12 and 82. With this operation, the presence of the p-type channel stopper regions is confirmed. Even if the n-type diffusion layer 13 and the p-type channel stopper region 12 are slightly spaced apart from each other due to masking in a manufacturing operation, they have an overlapping portion therebetween because the n-type diffusion layer is diffused in the transverse direction by about 0.2 to 0.4 $\mu m$, and the p-type channel stopper region is diffused by 0.4 to 0.6 $\mu m$. Boron ions implanted in the formed n-type diffusion layer 13 are diffused to form the p-type channel stopper region 12 so as to overlap by 0.2 $\mu m$ or more. With this structure, the junction breakdown voltage value of the n-type diffusion layer 13 reflects the impurity concentration at the portion of the p-type channel stopper region positioned on each bottom surface of the field oxide film 51.

According to the present invention, since the impurity concentration of the p-type channel stopper region is evaluated on the basis of the junction breakdown voltage, an intrinsic breakdown does not occur in the oxide film 14 as thin as the gate silicon oxide film 84. Since only one aluminum electrode which a measuring probe contacts is required, a wasteful space can be eliminated. Further, since a check operation is not affected by the film thickness of the field oxide film, the quality of the p-type channel stopper region can be checked with a high sensitivity, allowing evaluation of element isolation properties.

Next, a method of manufacturing a semiconductor device according to the first embodiment will be described with reference to FIGS. 5A to 5E. Since the circuit and check elements are manufactured simultaneously, as described above, only the check element is illustrated in FIGS. 5A to 5E.

Figure 5A:
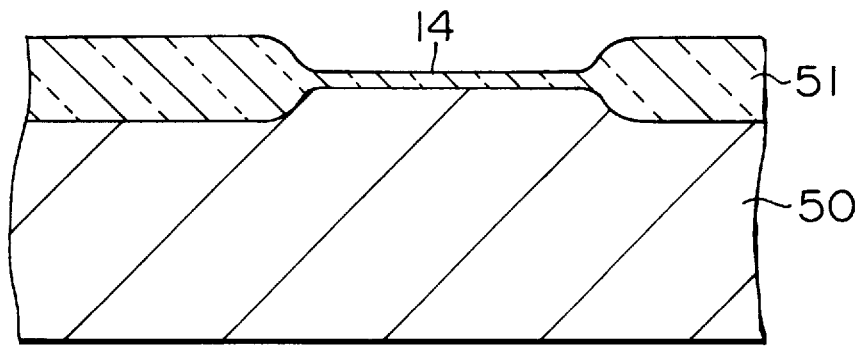
FIGS. 5A to 5E are sectional views, respectively, showing the steps in a method in manufacturing the first embodiment of the present invention.

A field oxide film 51 is selectively formed on the major surface of a p-type silicon substrate 50 in which boron is doped at about $1 \times 10^{15}$ cm$^{-3}$, by local oxidation of silicon called the LOCOS technique using a silicon nitride film as a mask. The MOS transistor formation region of a circuit element is partitioned by the field oxide film 51 in a circuit element region, while a substrate region isolated in an island shape is partitioned by the opening of the field oxide film 51 in a check element formation region. After ions for adjusting the threshold voltage of the MOS transistor are implanted in the circuit element region, as needed, a gate oxide film and a thin silicon oxide film 14 are simultaneously formed by thermal oxidation in the circuit and check element regions, respectively. The film thickness of each film is about 20 nm (FIG. 5A).

Figure 5B:
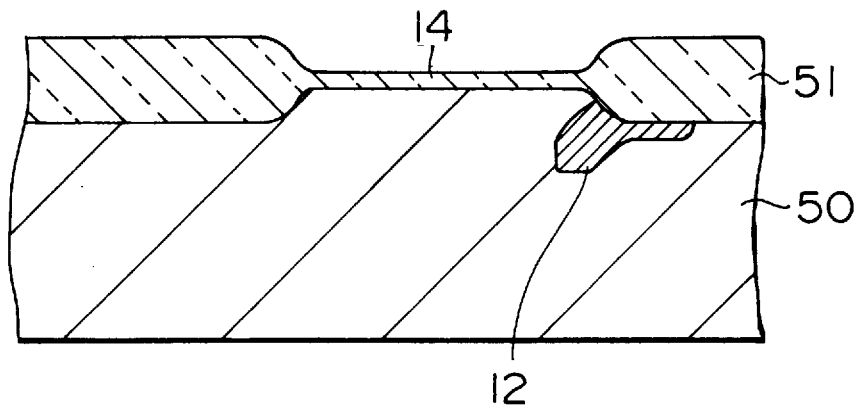

A resist pattern having a predetermined opening portion is formed on the entire field oxide film 51 and used as a mask to implant boron ions through the field oxide film 51 below the resist opening portion under the conditions of an energy of 120 keV and a dose of $1 \times 10^{14}$ cm$^{-2}$. By an activation annealing process after the resist pattern is removed, p-type channel stopper regions are formed between circuit elements in the circuit element region, and a p-type channel stopper region 12 is formed near one end portion of the island-shaped opening of the field oxide film 51 (FIG. 5B). Note that, in the boron ion implantation step, preferable energy and dose ranges are 100 keV to 150 keV and $1 \times 10^{12}$ cm$^{-2}$ to $1 \times 10^{15}$ cm$^{-2}$.

Figure 5C:
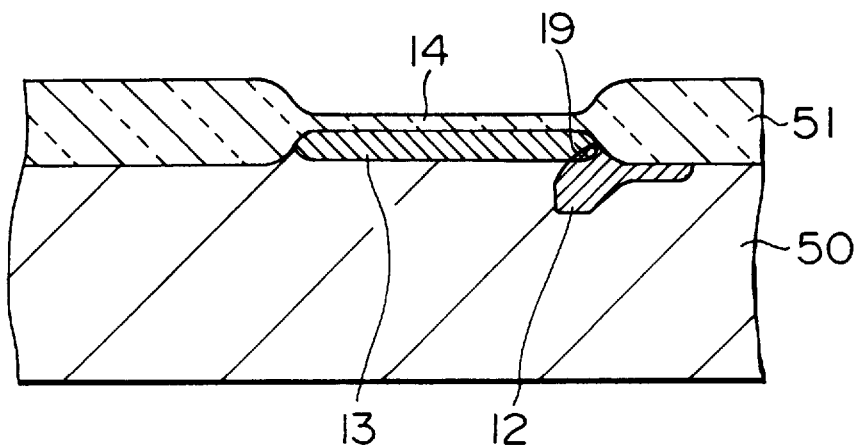

After polysilicon gate electrodes are formed in the circuit element region, arsenic ions are implanted using the field oxide film 51 and the polysilicon gate electrodes as a mask under the conditions of an energy of 70 keV and a dose of $1 \times 10^{15}$ cm$^{-2}$. By a subsequent activation annealing process, n-type source and drain regions are formed in the circuit element region, and an n-type diffusion layer 13 overlapping the p-type channel stopper region 12 at a contact portion 19 is formed in the substrate region isolated in an island shape within the opening of the field oxide film 51 in the check element region (FIG. 5C).

Figure 5D:
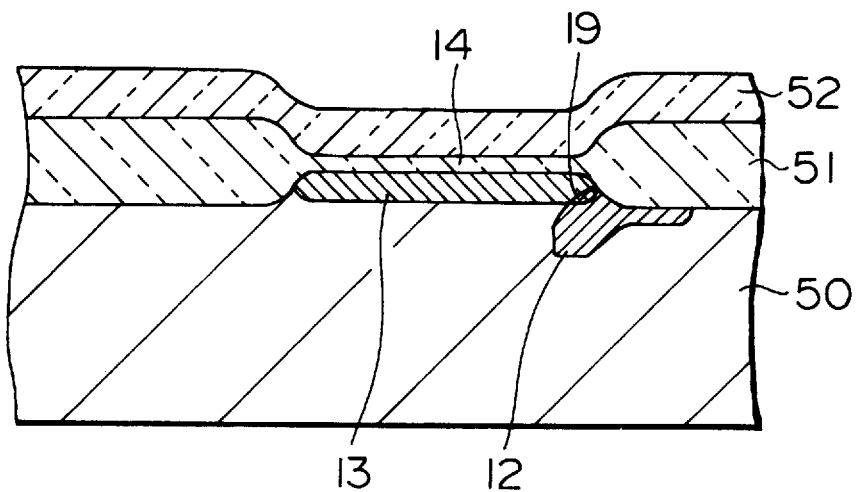
Figure 5E:
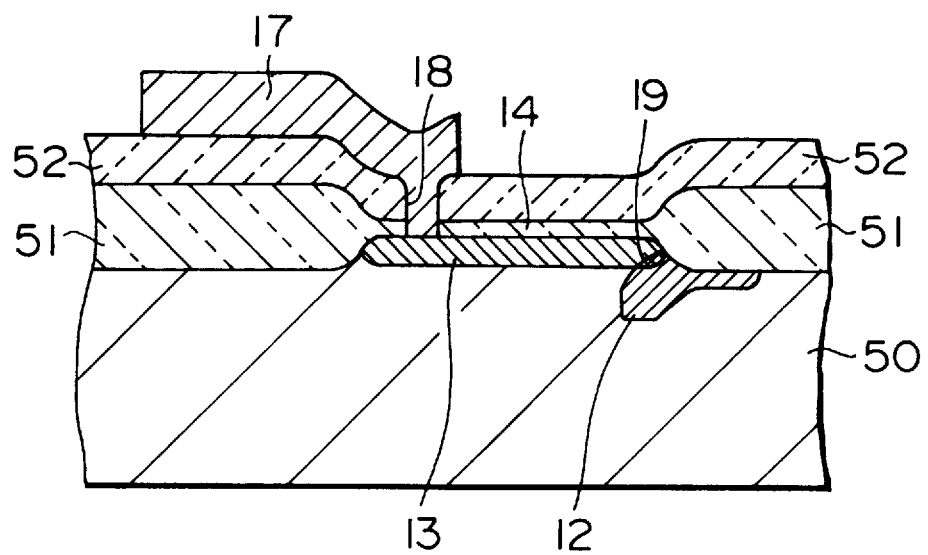

A BPSG film 52 serving as an insulating interlayer is formed on the whole structure (FIG. 5D). A contact hole 18 is formed, and an aluminum film is deposited and patterned to simultaneously form an aluminum electrode wiring layer in the circuit element region and an aluminum electrode 17 in the check element region (FIG. 5E).

When particularly a CMOS is to be formed in the circuit element region, processes such as formation of the source and drain regions of a p-channel MOS transistor, and channel doping, are performed, which are not directly related to the present invention and will not be explained.

In the above embodiment, the channel stopper region is formed by high-energy ion implantation upon formation of the gate oxide film and the thin silicon oxide film 14 by oxidation. Alternatively, this ion implantation may be performed prior to formation of the gate oxide film and the thin silicon oxide film 14 by oxidation.

Although the above manufacturing method is explained using the p-type semiconductor substrate, this method can be used for a p-type semiconductor substrate or the p-well portion (p-well in which boron is doped by about $10^{16}$ cm$^{-3}$) of an n-type semiconductor substrate.

In addition, practically suitable conditions for forming the p-type channel stopper region are energy within the range of 100 keV to 150 keV and dose within $1 \times 10^{12}$ cm$^{-2}$ to $5 \times 10^{15}$ cm$^{-2}$.

The junction breakdown voltage of the structure which is shown in FIGS. 2A and 2B and FIGS. 4A and 4B and manufactured in accordance with the manufacturing flow in FIGS. 5A to 5E and the conditions, and has element isolation properties, i.e., the breakdown voltage of the junction between the n-type diffusion layer 13 and the p-type channel stopper region 12 is about 10 V. This breakdown voltage changes by about 1 V upon a change by about 20% in dose of the p-type channel stopper region 12 while remaining conditions are kept unchanged.

Figure 6A:
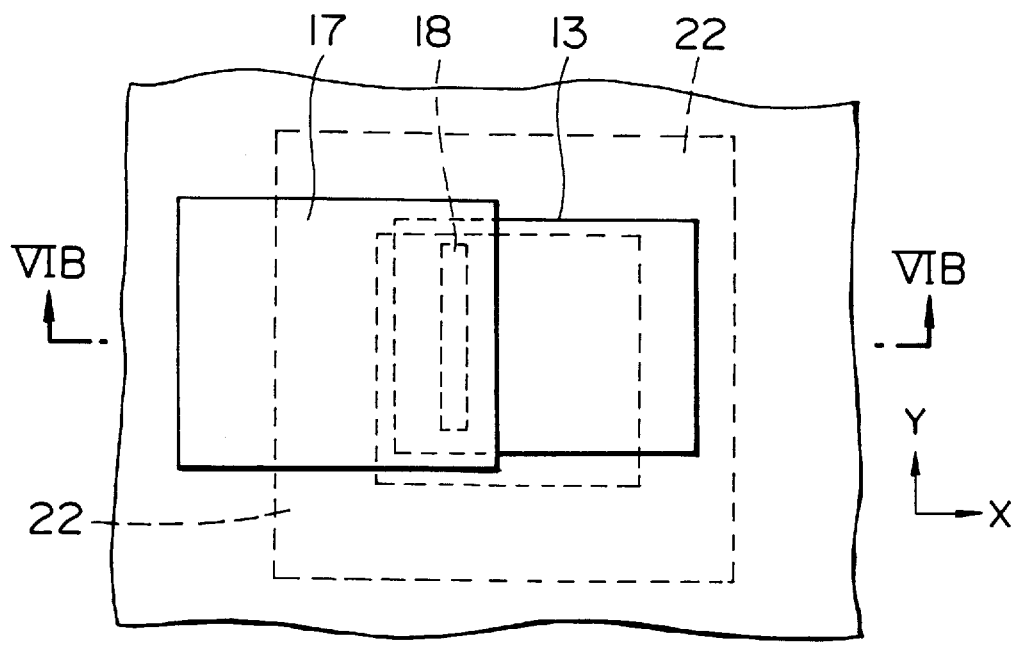
FIGS. 6A and 6B are a plan view and a sectional view, respectively, showing the second embodiment of the present invention.
Figure 6B:
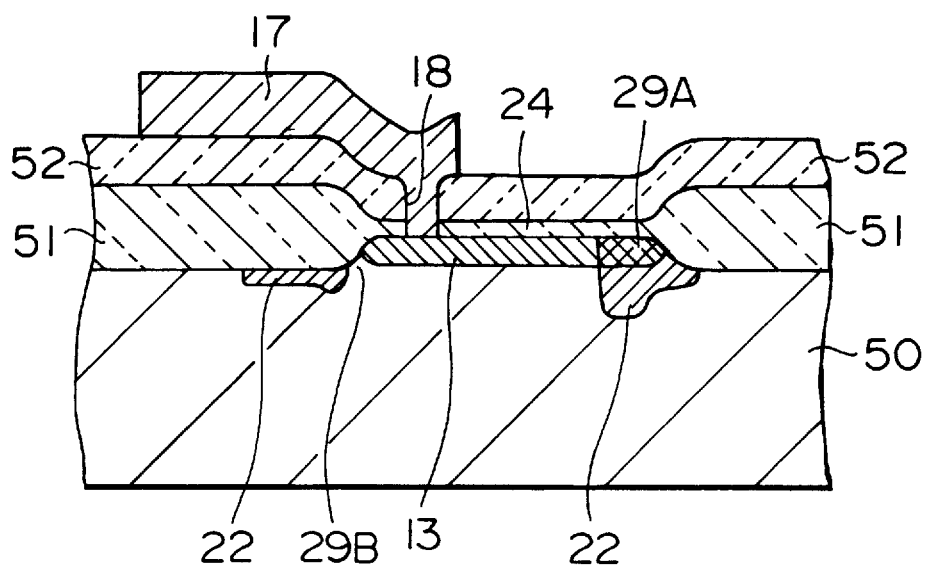
Figure 7A:
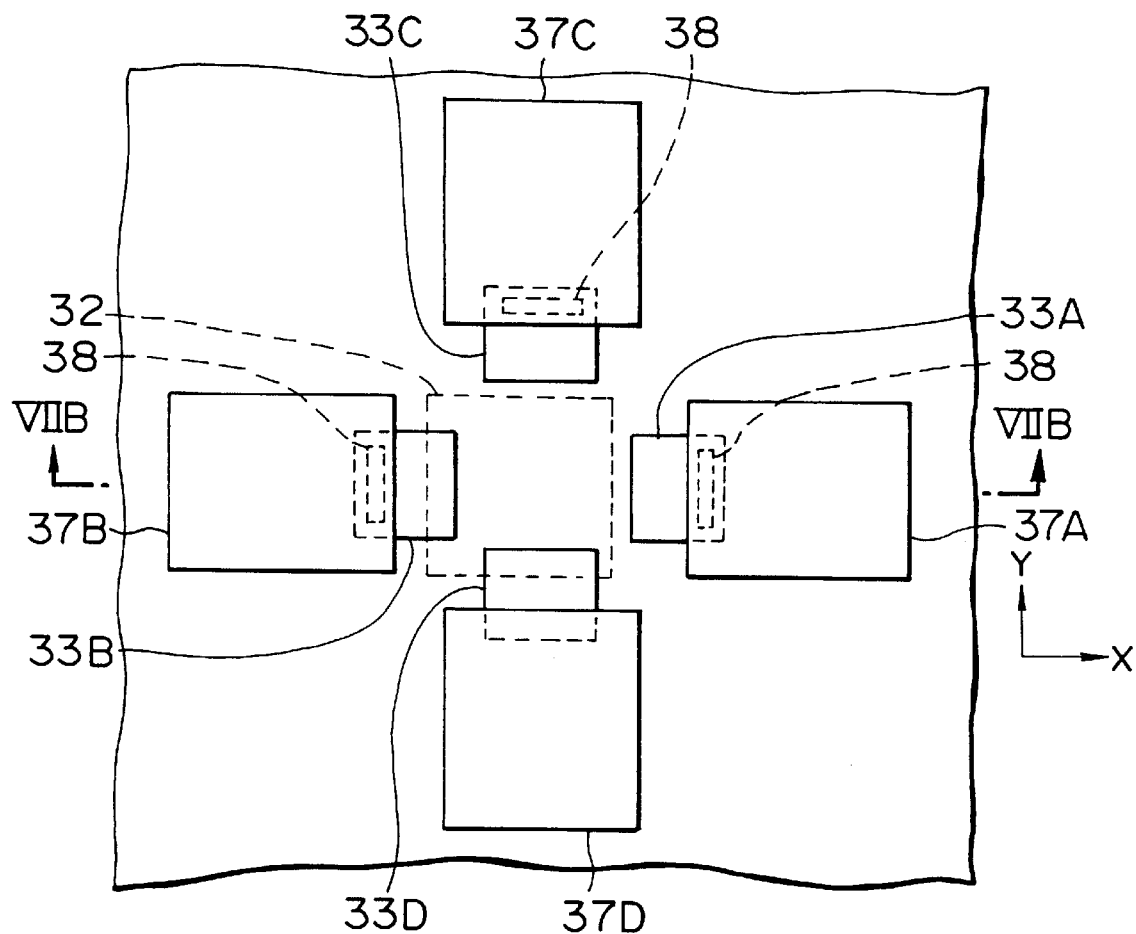
FIGS. 7A and 7B are a plan view and a sectional view, respectively, showing the third embodiment of the present invention.
Figure 7B:
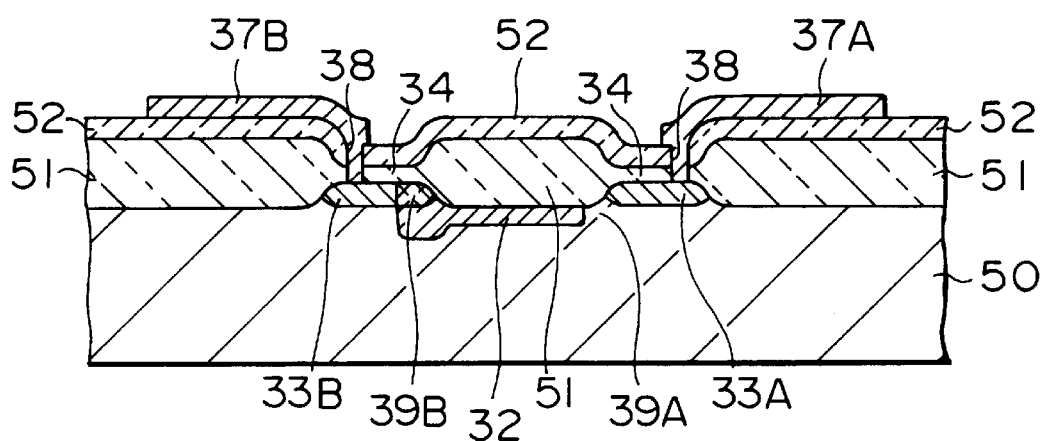

FIGS. 6A and 6B are views showing a check element in a semiconductor device according to the second embodiment of the present invention, in which FIG. 6A is a plan view, and FIG. 6B is a sectional view taken along a line VIB—VIB in FIG. 6A. FIGS. 7A and 7B are views showing a check element in a semiconductor device according to the third embodiment of the present invention, in which FIG. 7A is a plan view, and FIG. 7B is a sectional view taken along a line VIIB—VIIB in FIG. 7A. The same reference numerals as in FIGS. 4A and 4B showing the first embodiment denote the same portions in FIGS. 6A and 6B and FIGS. 7A and 7B respectively showing the second and third embodiments. In addition, the relationship with respect to a circuit element region, and the manufacturing method are the same as those in the first embodiment shown in FIGS. 2A and 2B, FIG. 3, and FIGS. 5A to 5E, and a repetitive description thereof will be omitted.

In the first embodiment, the p-type channel stopper region 12 is formed on only one side of the n-type diffusion layer 13. To the contrary, in the check element of the second embodiment, a p-type channel stopper region 22 is formed to surround all four sides of a flat, square n-type diffusion layer 13.

With this structure, even if the p-type channel stopper region 22 is formed to shift from the n-type diffusion layer 13 or a field oxide film 51 due to misalignment, the breakdown voltage of the junction between the p-type channel stopper region 22 and the n-type diffusion layer 13 can be measured to evaluate the impurity state of the p-type channel stopper region. If the p-type channel stopper region is formed to shift in the check element, a p-type channel stopper region in the circuit element region is also formed to shift. Therefore, this embodiment is applied to a semiconductor device in which a small shift of the position of a p-type channel stopper region in a circuit element region has no obstacle, but its impurity concentration state is important.

More specifically, in FIG. 6A, the p-type channel stopper region 22 is formed to shift to a lower left position with respect to the n-type diffusion layer 13. For this reason, the n-type diffusion layer 13 and the p-type channel stopper region 22 overlap at contact portions 29A on the right side and the upper side (upper side in a direction Y in FIG. 6A), but are spaced apart on the left side and the lower side (lower side in the direction Y in FIG. 6A) at contact portions 29B between the n-type diffusion layer 13 and the p-type channel stopper region 22. If they are spaced apart, a p-type impurity concentration is near the impurity concentration of the p-type substrate 50, and the junction breakdown voltage becomes higher. Since the p-type channel stopper region 22 has an integral ring shape, a low junction breakdown voltage is measured at the overlapping portion 29A to evaluate the impurity state of the p-type channel stopper region. Note that, as a modification of this embodiment, a p-type channel stopper region may be arranged on two or three sides of an n-type diffusion layer in a check element.

The check element of the embodiment shown in FIGS. 7A and 7B further evaluates the state of a positional shift between n-type diffusion layers and a p-type channel stopper region.

N-type diffusion layers 33A, 33B, 33C, and 33D are independently formed on four sides of a flat, square p-type channel stopper region 32 at the central portion. Aluminum electrodes 37A, 37B, 37C, and 37D are independently extracted through contact holes 38. In this embodiment, the p-type channel stopper region 32 is formed to shift to a lower left portion with respect to the n-type diffusion layers. For this reason, the p-type channel stopper region 32 and the n-type diffusion layers 33A and 33C are spaced apart at contact portions 39A on the right side and the upper side (upper side in a direction Y in FIG. 7A), and overlap at contact portions 39B on the left side and the lower side (lower side in the direction Y in FIG. 7A).

In this case, when measuring probes are brought in contact with the aluminum electrodes 37A and 37C, a high junction breakdown voltage is measured; when they are brought in contact with the aluminum electrodes 37B and 37D, a low junction breakdown voltage is measured. Therefore, it is confirmed that the p-type channel stopper region is formed to shift to a lower left portion with respect to the n-type diffusion layers in the check element. It can be recognized that p-type channel stopper regions for element isolation are formed to shift to lower left portions with respect to n-type source and drain regions similarly in the circuit element region.

A method of quantatively evaluating a misalignment amount using the check element as shown in FIGS. 7A and 7B will be explained. Note that only the case of a shift in a direction X in FIG. 7A will be explained, but this explanation also applies to the case of a shift in the direction Y.

When no misalignment occurs, five check elements as shown in FIG. 7A, i.e., a check element in which the central p-type channel stopper region 32 and the right and left n-type diffusion layers 33A and 33B overlap by, e.g., 2 $\mu$m (+2.0-$\mu$m check element), a check element in which they overlap by 1 $\mu$m (+1.0-$\mu$m check element), a check element in which they just abut against each other (0-$\mu$m check element), a check element in which they are spaced apart by 1 $\mu$m (-0.1-$\mu$m check element), and a check element in which they are spaced apart by 2 $\mu$m (-2.0-$\mu$m check element) are formed simultaneously with MOS transistors and p-type channel stopper regions in circuit element regions.

A case in which a p-type channel stopper region is formed to shift from a regular position by 1.5 $\mu$m in the left direction due to misalignment, i.e., a case in which p-type channel stopper regions are formed to shift by 1.5 $\mu$m in the left direction with respect to n-type diffusion layers in a check element and with respect to n-type source and drain regions in a corresponding circuit element region will be described.

In the +2.0-$\mu$m check element, since the right and left n-type diffusion layers overlap the p-type channel stopper region, a low breakdown voltage (e.g., 8 V) is measured. In the +1.0-$\mu$m check element, since the left n-type diffusion layer overlaps the p-type channel stopper region, a low breakdown voltage is measured; since the right n-type diffusion layer is spaced apart from the p-type channel stopper region due to the shift of the p-type channel stopper region, and the breakdown voltage is the breakdown voltage of the junction with a lightly doped p-type substrate, a high breakdown voltage of, e.g., 16 V is measured. In the 0- and −1-$\mu$m check elements, since the left n-type diffusion layer overlaps the p-type channel stopper region, a low breakdown voltage is measured; since the right n-type diffusion layer is spaced apart from the p-type channel stopper region, a high breakdown voltage is measured. In the −2-$\mu$m check element, since the left n-type diffusion layer is spaced apart from the p-type channel stopper region even if the p-type channel stopper region shifts by 1.5 $\mu$m in the left direction, a high breakdown voltage is measured; since the right n-type diffusion layer 33A is further spaced apart from the p-type channel stopper region, a high breakdown voltage is measured.

Figure 8:
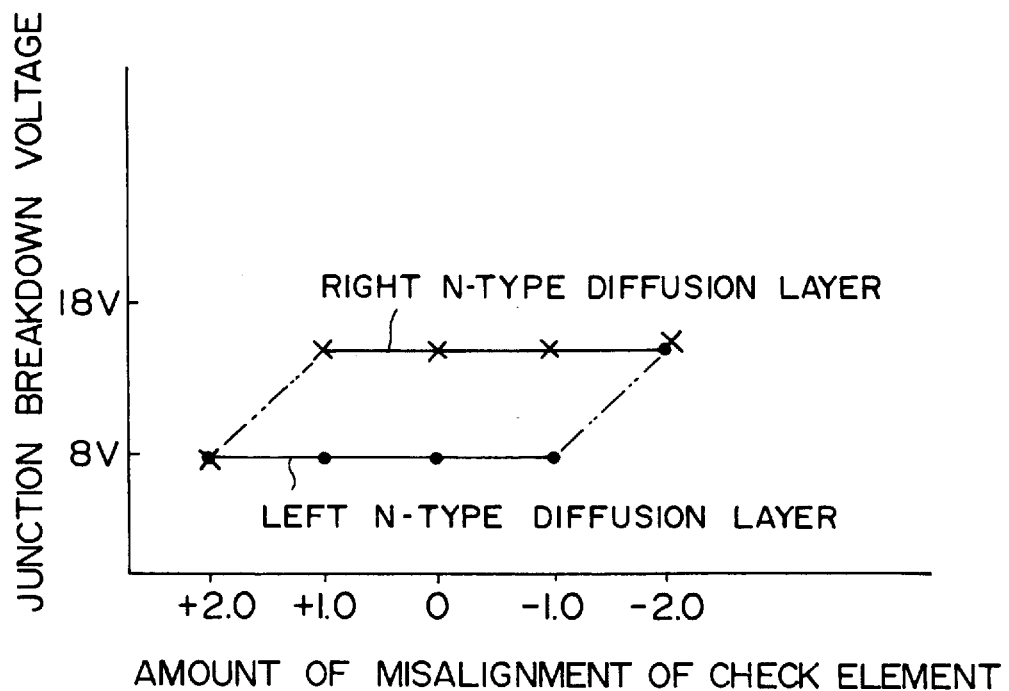
FIG. 8 is a graph showing a method of obtaining an amount of misalignment of a check element in relation to the third embodiment in FIGS. 7A and 7B.

This state is shown in the graph of FIG. 8. From this graph, it is determined that the p-type channel stopper region shifts in the left direction by a shift amount which is more than 1 $\mu$m and less than 2 $\mu$m.

If a larger number of check elements are formed by more finely changing a shift amount, the shift amount of the p-type channel stopper region can be obtained more accurately. Alternatively, when the shift amount is roughly obtained in advance, check elements are formed by finely changing a shift amount around this shift amount, thereby obtaining the shift amount of the p-type channel stopper region more accurately.

Figure 9A:
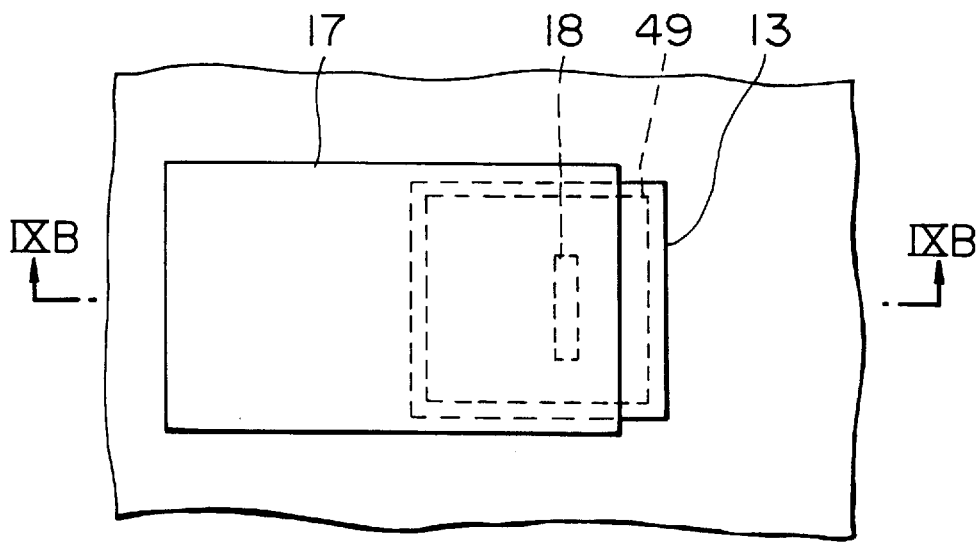
FIGS. 9A and 9B are a plan view and a sectional view, respectively, showing the fourth embodiment of the present invention.
Figure 9B:
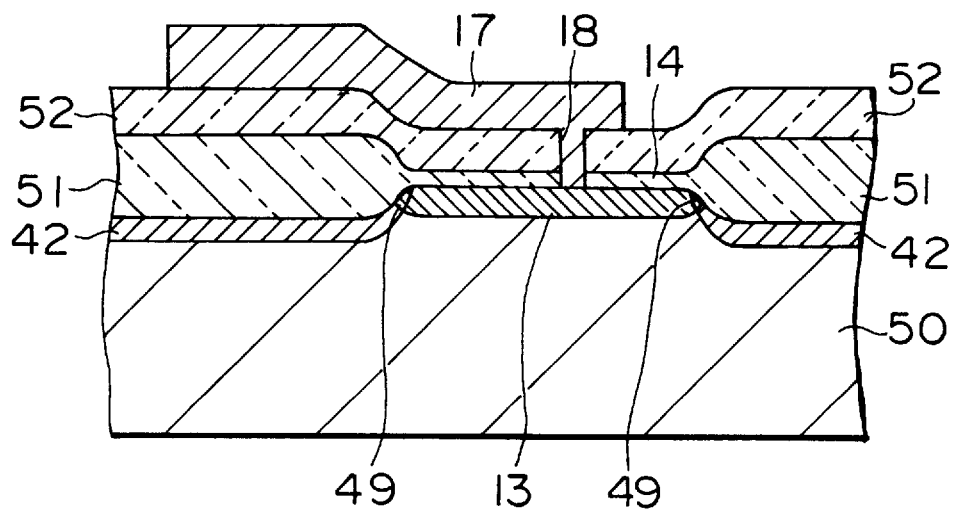

FIGS. 9A and 9B are views showing a check element in a semiconductor device according to the fourth embodiment of the present invention, in which FIG. 9A is a plan view, and FIG. 9B is a sectional view taken along a line IXB—IXB in FIG. 9A. The same reference numerals as in the first embodiment shown in FIGS. 4A and 4B denote the same or similar portions in FIGS. 9A and 9B, and a repetitive description thereof will be omitted.

In FIGS. 9A and 9B, a p-type channel stopper region 42 is formed in an entire region below a field oxide film 51 serving as circuit and check element regions. Therefore, this embodiment is applied to a semiconductor device in which elements can be isolated in a circuit element region even if the impurity concentration of a p-type channel stopper region is not set so high, and a semiconductor device in which a high breakdown voltage is not required at the junction between a p-type channel stopper region and n-type source and drain regions. In the check element region, a portion of the p-type channel stopper region 42 extending upward to a substrate surface along the lower portion of a bird's beak at the end of a field oxide film 51 overlaps an n-type diffusion layer 13 at a contact portion 49. The state of the p-type channel stopper region 42 is evaluated in accordance with the junction breakdown voltage at the contact portion 49.

Next, a method of manufacturing the semiconductor device according to the fourth embodiment will be described with reference to FIGS. 10A to 10E. As described above, the circuit and check elements are manufactured simultaneously, so that only the check element will be described.

Figure 10A:
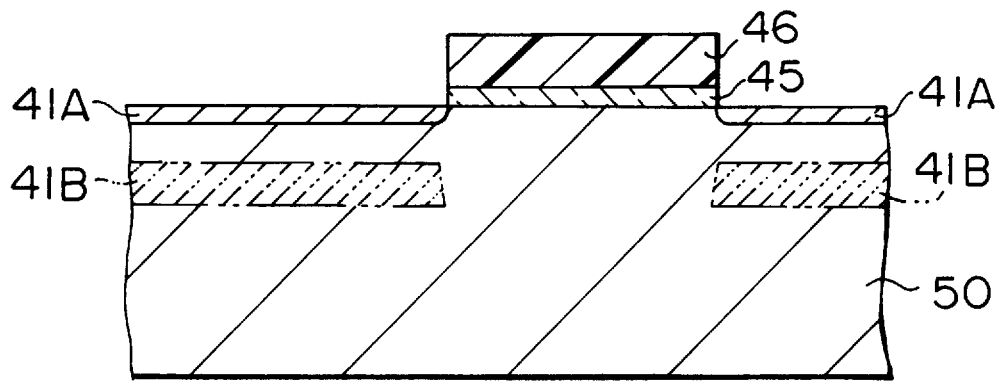
FIGS. 10A to 10E are sectional views respectively showing the steps in a method in manufacturing the fourth embodiment of the present invention.

A silicon nitride film 45 is grown to a film thickness of about 120 nm on the entire major surface of a p-type silicon substrate 50 in which boron is doped at about $1\times10^{15}$ cm$^{-3}$. A photoresist pattern 46 is formed thereon and used as a mask to selectively etch the silicon nitride film 45. Boron ions are implanted in the major surface portion of a substrate serving as a field region using the photo-resist pattern 46 and the silicon nitride film 45 as a mask at an energy of 100 keV and a dose of $1\times10^{13}$ cm$^{-2}$, thereby forming a p-type ion-implanted layer 41A. Alternatively, boron ions are implanted at an energy of 300 keV and a dose of $1\times10^{13}$ cm$^{-2}$, thereby forming a p-type ion-implanted layer 41B implanted inside the substrate at a high energy (FIG. 10A).

Figure 10B:
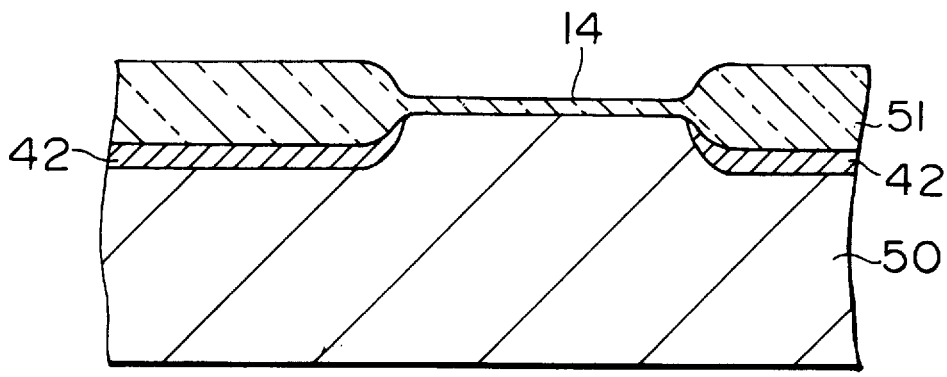

After the photoresist pattern 46 is removed, a field oxide film 51 is selectively formed by a local thermal oxidation method using the silicon nitride film 45 as a mask. At this time, the ion-implanted layer 41A or 41B is activated to attach to the entire bottom surface of the field oxide film 51 and to serve as the p-type channel stopper region 42 extending upward to the substrate surface along the lower portion of a bird's beak at the end of the field oxide film 51. Then, the silicon nitride film 45 is removed, and a gate oxide film and a thin oxide film 14 are simultaneously formed in the circuit and check element regions, respectively. The film thickness of each oxide film is about 20 nm (FIG. 10B).

Figure 10C:
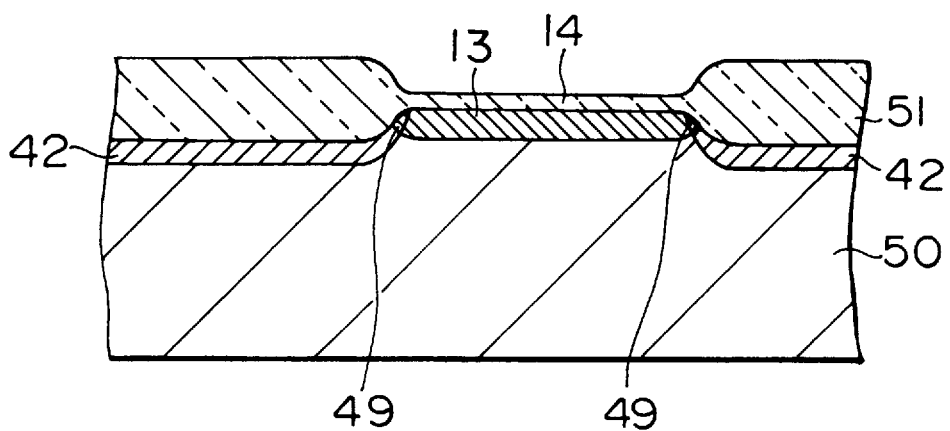

After polysilicon gate electrodes are formed in the circuit element region, arsenic ions are implanted using the field oxide film 51 and the polysilicon gate electrodes as a mask under the conditions of an energy of 70 keV and a dose of $1\times10^{15}$ cm$^{-2}$. Then, by an activation thermal process, n-type source and drain regions are formed in the circuit element region, and an n-type diffusion layer 13 overlapping a p-type channel stopper region 42 at a contact portion 49 is formed on the substrate within the opening of the field oxide film 51 in the check element region (FIG. 10C).

Figure 10D:
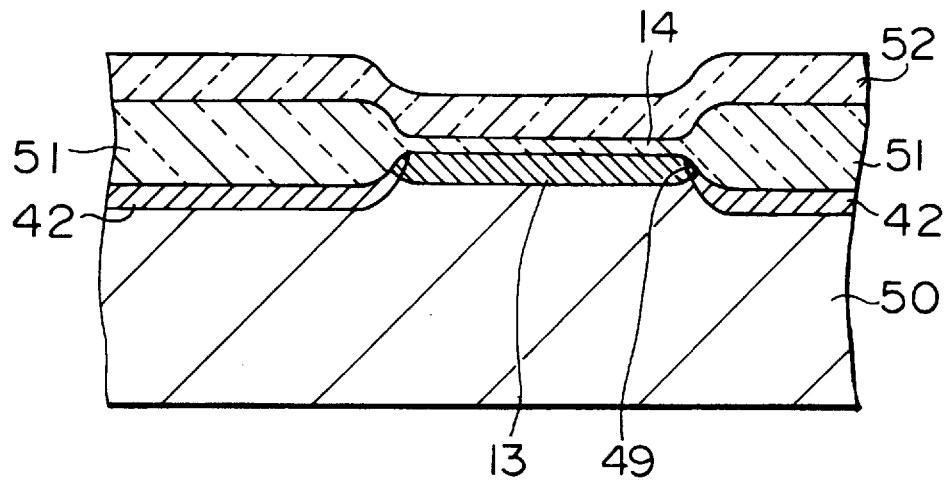
Figure 10E:
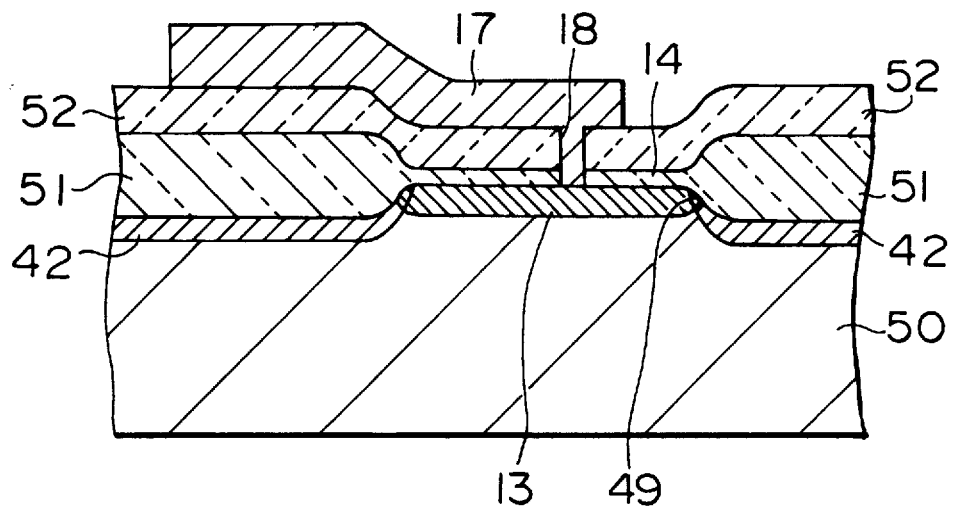

A BPSG film 52 serving as an insulating interlayer is formed on the whole structure (FIG. 10D). A contact hole 18 is formed, and an aluminum film is deposited and patterned to simultaneously form an aluminum electrode wiring layer in the circuit element region and an aluminum electrode 17 in the check element region (FIG. 10E).

Also in this embodiment, when particularly a CMOS is to be formed in the circuit element region, processes of formation of the source and drain regions of a p-channel MOS transistor, channel doping, and the like are performed, which are not directly related to the present invention and will not be explained. Although the manufacturing method shown in FIGS. 10A to 10E is explained using the p-type semiconductor substrate, this method can be used for a p-type semiconductor substrate or the p-well portion of an n-type semiconductor substrate (p-well in which boron is doped at about $10^{16}$ cm$^{-3}$), similar to the manufacturing method of the above embodiment.

What is claimed is:

1. A semiconductor device comprising:
   circuit element regions formed in one of a p-type semiconductor substrate and a p-type well covered with a field oxide film;
   a check element region also formed in said one of a p-type semiconductor substrate and a p-type well covered with a field oxide film, isolated from said circuit element regions, said check element region for checking a state of a p-type channel stopper region by measuring a junction breakdown voltage of an n-type diffusion layer,
   said check element region comprised of said n-type diffusion layer formed to contact at least one side of said p-type channel stopper region, said p-type channel stopper region having a deeper bottom in a first region below said n-type diffusion layer than in a second region below said field oxide film and an electrode extracted from said n-type diffusion layer through a contact hole.

2. A device according to claim 1, wherein said p-type channel stopper region is formed between circuit elements in said circuit element regions and near one end portion of an opening of said field oxide film in said check element region.

3. A device according to claim 1, wherein said p-type channel stopper region is formed to surround said n-type diffusion layer.

4. A device according to claim 1, wherein said p-type channel stopper region has four square, flat shape, n-type diffusion layers formed to independently contact respective sides of said p-type channel stopper region, and electrodes are respectively extracted from said n-type diffusion layers.

5. A device according to claim 1, wherein said p-type channel stopper region is formed in an entire region below said field oxide film serving as said circuit element regions and said check element region.

6. The semiconductor device of claim 1 wherein said p-type channel stopper region and said n-type diffusion layer overlap each other.

7. The semiconductor device of claim 1 further comprising only one n-type diffusion layer and only one electrode extracted from said one n-type diffusion layer.

8. A semiconductor device comprising:
   a circuit element region formed in one of a p-type semiconductor substrate and a p-type well covered with a field oxide film;
   a check element region, also formed in said one of a p-type semiconductor substrate and a p-type well covered with a field oxide film, isolated from said circuit element regions, said check element region for checking a state of a p-type channel stopper region by measuring a junction breakdown voltage of an n-type diffusion layer,
   said check element region comprised of a plurality of n-type diffusion layers formed in said check element region such that at least one of said n-type diffusion layers contacts said p-type channel stopper region, said p-type channel stopper region having a deeper bottom in a first region below said n-type diffusion layer than in a second region below said field oxide film, said plurality of n-type diffusion layers arranged such that said check element measures any positional shift between said plurality of n-type diffusion layers and said p-type channel stopper region, and an electrode extracted through a contact hole to at least one of said plurality of n-type diffusion layers.

* * * * *